United States Patent
Kim et al.

(10) Patent No.: US 7,156,950 B2
(45) Date of Patent: Jan. 2, 2007

(54) GAS DIFFUSION PLATE FOR USE IN ICP ETCHER

(75) Inventors: Hong-Seub Kim, Yongin-si (KR); Bu-Jin Ko, Joong-gu (KR)

(73) Assignee: Jusung Engineering Co., Ltd (KR)

( * ) Notice: Subject to any disclaimer, the term of this patent is extended or adjusted under 35 U.S.C. 154(b) by 255 days.

(21) Appl. No.: 10/348,550

(22) Filed: Jan. 21, 2003

(65) Prior Publication Data

US 2003/0136516 A1    Jul. 24, 2003

(30) Foreign Application Priority Data

Jan. 22, 2002    (KR) ...................... 10-2002-0003587

(51) Int. Cl.
*C23F 1/10* (2006.01)
*H01L 21/306* (2006.01)
*C23C 16/507* (2006.01)

(52) U.S. Cl. .............................. 156/345.48; 118/723 I; 118/723 IR

(58) Field of Classification Search ................ 118/715, 118/728, 50, 723 I, 723 IR; 156/345.29, 156/345.33–345.36, 345.48
See application file for complete search history.

(56) References Cited

U.S. PATENT DOCUMENTS

| | | | | |
|---|---|---|---|---|
| 4,456,519 A | * | 6/1984 | Zollner et al. | 204/290.01 |
| 5,010,842 A | * | 4/1991 | Oda et al. | 118/723 ME |
| 5,054,420 A | * | 10/1991 | Raghavan et al. | 118/715 |
| 5,068,871 A | * | 11/1991 | Uchida et al. | 373/17 |
| 5,160,544 A | * | 11/1992 | Garg et al. | 118/724 |
| 5,522,934 A | * | 6/1996 | Suzuki et al. | 118/723 AN |
| 5,741,363 A | * | 4/1998 | Van Buskirk et al. | 118/715 |
| 5,855,678 A | * | 1/1999 | Sanjurjo et al. | 118/715 |
| 5,904,571 A | * | 5/1999 | Patrick et al. | 438/731 |
| 5,982,100 A | * | 11/1999 | Ghanbari | 315/111.21 |
| 6,007,633 A | * | 12/1999 | Kitamura et al. | 118/724 |
| 6,089,182 A | * | 7/2000 | Hama | 118/723 I |
| 6,090,210 A | | 7/2000 | Ballance et al. | |
| 6,101,969 A | * | 8/2000 | Niori et al. | 118/723 E |
| 6,123,802 A | * | 9/2000 | Donohoe | 156/345.48 |
| 6,132,512 A | * | 10/2000 | Horie et al. | 118/715 |
| 6,203,657 B1 | * | 3/2001 | Collison et al. | 156/345.48 |
| 6,245,192 B1 | * | 6/2001 | Dhindsa et al. | 156/345.34 |
| 6,415,736 B1 | * | 7/2002 | Hao et al. | 118/723 E |
| 6,585,237 B1 | * | 7/2003 | Pagade | 261/94 |
| 6,761,796 B1 | * | 7/2004 | Srivastava et al. | 156/345.38 |
| 2002/0078893 A1 | * | 6/2002 | Os et al. | 118/723 I |
| 2002/0088542 A1 | * | 7/2002 | Nishikawa et al. | 156/345.29 |
| 2003/0136516 A1 | * | 7/2003 | Kim et al. | 156/345.33 |
| 2003/0165689 A1 | * | 9/2003 | Miller et al. | 428/419 |

(Continued)

FOREIGN PATENT DOCUMENTS

JP        09-088558        3/1997

(Continued)

*Primary Examiner*—Rudy Zervigon
(74) *Attorney, Agent, or Firm*—Baker & Daniels LLP

(57) ABSTRACT

A gas diffusion plate supplying process gases into a chamber of an ICP (inductively coupled plasma) etcher is provided in the present invention. The gas diffusion plate includes a porous plate comprised of a plurality of balls and formed by compressing and curing the plurality of balls, the porous plate having a circular planar shape; a plurality of gas flow grooves formed on an upper surface of the porous plate; and a gas distribution plate having a plurality of gas-feed holes at the bottom thereof and a plurality of gas-feed passages in the side portion thereof, the gas distribution plate surrounding lower and side portions of the porous plate.

11 Claims, 3 Drawing Sheets

U.S. PATENT DOCUMENTS

2003/0168008 A1* 9/2003 Ohmi et al. ................. 118/715
2003/0178144 A1* 9/2003 Ohmi et al. ........... 156/345.41
2004/0067354 A1* 4/2004 Ohya et al. .............. 428/304.4

FOREIGN PATENT DOCUMENTS

WO      WO 01/03159 A1    1/2001

* cited by examiner

GAS DIFFUSION PLATE FOR USE IN ICP ETCHER

This application claims the benefit of Korean Patent Application No. 2002-0003587 filed on Jan. 22, 2002, in Korea, which are both hereby incorporated by reference.

BACKGROUND OF THE INVENTION

1. Field of the Invention

The present invention relates to an apparatus for forming semiconductor devices, and more particularly, to a gas diffusion plate that allows process gases to be uniformly supplied into an ICP (Inductively Coupled Plasma) etcher.

2. Description of Related Art

The semiconductor devices, such as a LSI (Large Scale Integrated), a memory IC (Integrated Circuit) and other logic elements, are generally fabricated by repeated depositing and etching processes. In the most recent, a high density plasma (HDP) is applied for etching the semiconductor device in an etching apparatus, for example, an inductively coupled plasma (ICP) etcher. In the etching apparatus, e.g., the ICP etcher, a method of applying process gases is classified as two types; an edge injection type and a shower head type.

FIG. 1 schematically illustrates a diagram of an edge injection type ICP etcher according to a related art.

In the edge injection type ICP etcher shown in FIG. 1, an ICP antenna 120 is disposed over a chamber cover 112 made of ceramic. Although the chamber cover 112 has a plate shape in FIG. 1, the chamber cover 112 can have a dome shape. A chuck supporter 160 connected to an RF (radio frequency) power supply 150 is disposed at the bottom of a chamber 100. The chuck supporter 160 acts as a cathode in the ICP etcher. An electrostatic chuck (ESC) 140 is disposed on the chuck supporter 160, and thus a semiconductor wafer (not shown) is fixed into the electrostatic chuck 140 by static electricity during the process. Meanwhile, process gases are supplied into the chamber 100 from edge injectors 130 that are on a chamber wall 110. The edge injectors 130 are connected to gas-supplying passages (not shown) that are installed in the chamber wall 110 so that the process gases are injected from the edge injectors 130 throughout the gas-supplying passages (not shown).

In the edge injection type ICP etcher described above, there is enough room between the chamber cover 112 and the electrostatic chuck 140, and the room therebetween is wide enough to obtain the uniformity of etching process under the pressure of less than 10 mT. However, in the recent etching process, particularly during the process of etching the oxide film, the room between the chamber cover 112 and the electrostatic chuck 140 becomes narrower in order to control the dissociation mechanism of the etching gases.

If the edge injection type ICP etcher shown in FIG. 1 has the narrower space between the chamber cover 112 and the electrostatic chuck 140, the supplied process gases hardly reach a central portion of the semiconductor wafer during the process and most of the supplied process gases are ejected through a gas outlet (not shown) that is connected to a pumping device (not shown). To overcome these disadvantages, the shower head type ICP etcher is generally and widely used.

FIG. 2 schematically illustrates a diagram of a shower head type ICP etcher according to a related art. Wherever possible, the same reference numbers will be used throughout the drawings to refer to the same or similar parts.

In the shower head type ICP etcher shown in FIG. 2, an ICP antenna 120 is disposed over a chamber cover 112 made of ceramic. Although FIG. 2 shows the chamber cover 112 having a plate shape, the chamber cover 112 can also have a dome shape. A chuck supporter 160 connected to an RF (radio frequency) power supply 150 is disposed at the bottom of a chamber 100. The chuck supporter 160 acts as a cathode in the ICP etcher. An electrostatic chuck (ESC) 140 is disposed on the chuck supporter 160, and then a semiconductor wafer (not shown) is fixed into the electrostatic chuck 140 by static electricity during the process. A shower head 132 is installed in the chamber cover 112.

Unlike the edge injection type ICP etcher shown in FIG. 1, the shower head type ICP etcher of FIG. 2 supplies the process gases into the chamber 100 through the shower head 132. The shower head 132 is located right above the central portion of the semiconductor wafer (not show) and has a plurality of gas injection holes (not shown) therein so that the process gases are injected from the shower head 132 throughout the gas injection holes (not shown).

Meanwhile, in these days, the semiconductor wafer tends to become larger to have a diameter of about 300 mm, and the room between the chamber cover 100 and the electrostatic chuck 140 also tends to be narrower. Therefore, although the above-described shower head type ICP etcher is used to let the process gases to reach the central portion of the semiconductor wafer, the uniformity of etching process is hardly obtained because the gas injection holes of the shower head 132 provides the different pressure of the injecting gas depending on where the gas injection holes are disposed. Namely, the amount of gas and the gas injection speed are different among the gas injection holes of the shower head 132.

SUMMARY OF THE INVENTION

Accordingly, the present invention is directed to a gas diffusion plate for use in an ICP etcher, which substantially overcomes one or more of the problems due to limitations and disadvantages of the related art.

An advantage of the present invention is to provide a gas diffusion plate that makes superior process uniformity although the ICP etcher has a narrow room between a chamber cover and an electrostatic chuck and although a semiconductor wafer has a wide diameter.

Another advantage of the present invention is to provide a gas diffusion plate that makes supplied gases have equal pressures so that superior process uniformity can be obtained in the ICP etcher.

Additional features and advantages of the invention will be set forth in the description that follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the principles of the present invention provides a gas diffusion plate supplying process gases into a chamber of an ICP (inductively coupled plasma) etcher. The gas diffusion plate includes a porous plate comprised of a plurality of balls and formed by compressing and curing the plurality of balls, the porous plate having a circular planar shape; a plurality of gas flow grooves formed on an upper surface of the porous plate; and a gas distribution plate having a plurality of gas-feed holes at the bottom thereof and a plurality of gas-feed passages in the side portion thereof, the gas distribution plate surrounding lower and side portions of the porous plate.

According to the present invention, the plurality of balls are ceramic balls or VESPEL™ balls (a polymer base material). The plurality of gas-feed holes are uniformly distributed at the bottom of the gas distribution plate. The plurality of gas-feed passages correspond to the plurality of gas flow grooves so as to feed the process gases into the chamber through the porous plate. The plurality of balls have diameters ranging from 0.5 to 5 millimeters (mm). Particularly, the plurality of balls have a diameter of about 1 millimeter (mm). Beneficially, the plurality of balls include an adhesive agent on the surfaces thereof before being compressed and cured. Beneficially, the plurality of gas flow grooves have a symmetrical radial shape.

In another aspect, the present invention provides a method for fabricating a gas diffusion plate that supplies process gases into a chamber of an ICP (inductively coupled plasma) etcher. The method for fabricating the gas diffusion plate includes providing a plurality of balls; forming a porous plate by compressing and curing the plurality of balls, the porous plate having a circular planar shape; forming a plurality of gas flow grooves on an upper surface of the porous plate; forming a gas distribution plate having a plurality of gas-feed holes at the bottom thereof and a plurality of gas-feed passages in the side portion thereof; and surrounding lower and side portions of the porous plate by the gas distribution plate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment of the invention and together with the description serve to explain the principle of the invention. In the drawings.

DETAILED DESCRIPTION OF ILLUSTRATED EMBODIMENTS

Reference will now be made in detail to illustrated embodiment of the present invention, examples of which are shown in the accompanying drawings. Wherever possible, the same reference numbers will be used throughout the drawings to refer to the same or similar parts.

FIGS. 3A to 3D illustrates a fabrication method for a diffusion plate for use in an ICP etcher according to the present invention.

Figure 1:
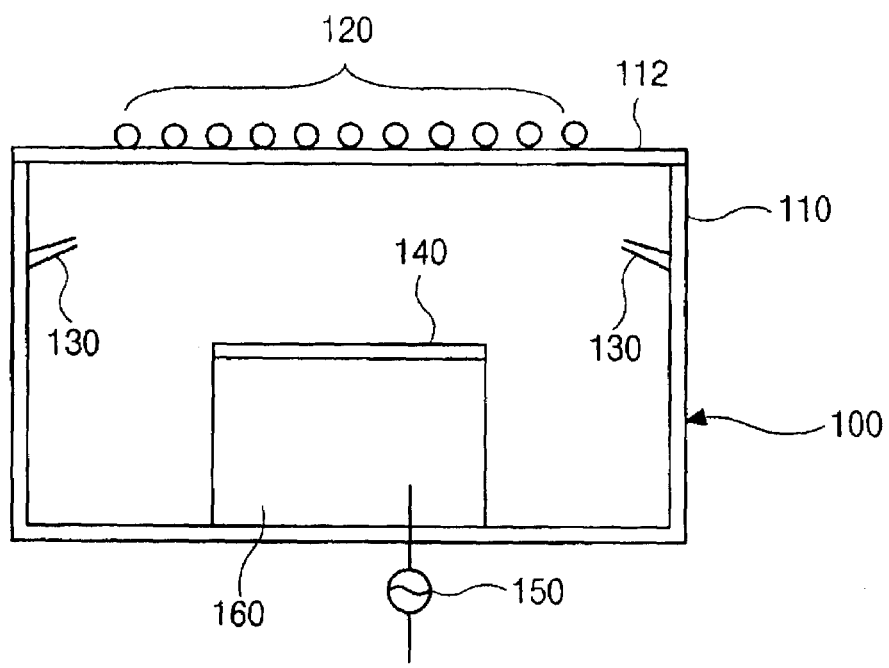
FIG. 1 schematically illustrates a diagram of an edge injection type ICP etcher according to a related art.
Figure 2:
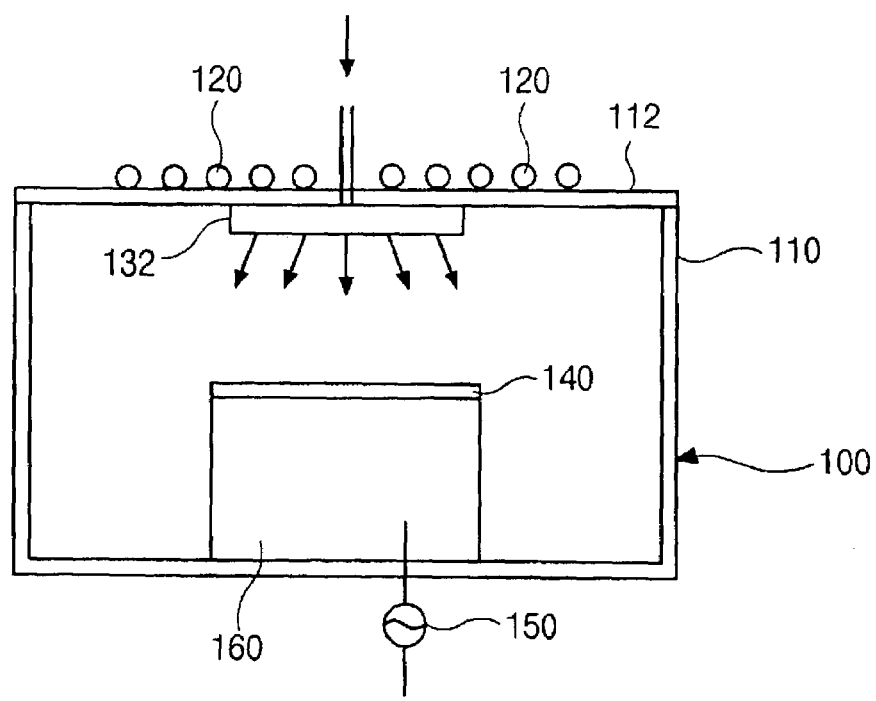
FIG. 2 schematically illustrates a diagram of a shower head type ICP etcher according to a related art.
Figure 3A:
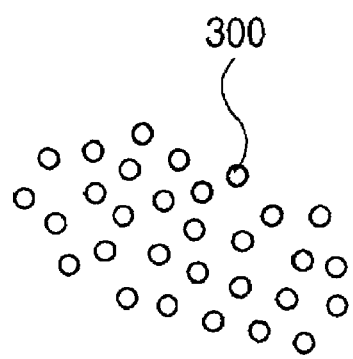
FIGS. 3A to 3D illustrates a fabrication method for a diffusion plate for use in an ICP etcher according to the present invention.

In FIG. 3A, a plurality of ceramic balls 300 each having a diameter of about 1 mm are provided. Instead of the ceramic balls 300, a plurality of VESPEL™ balls that are a polymer based material can be used. In the present invention, the ceramic or VESPEL™ balls have substantially diameters ranging from 0.5 to 5 mm. It is important in the present invention that the material for the gas diffusion plate must not form the polluting particles when the process gases are applied to the ICP etcher. Furthermore, the material for the gas diffusion plate should have heat resistant withstanding high temperature of about 200 to 300 Celsius degrees, and should be bearable against the plasma. The metallic balls cannot be used for the gas diffusion plate because if the metallic balls are used instead of the ceramic or VESPEL™ balls, the metallic balls obstruct the magnetic field that generates the inductively coupled plasma (ICP).

Figure 3B:
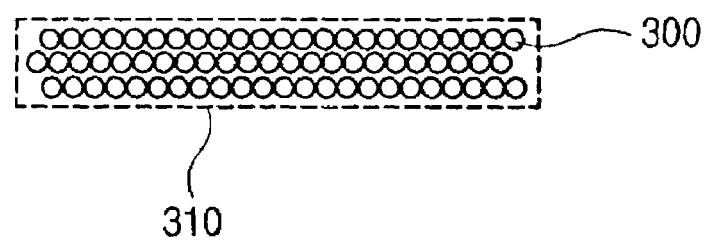

Next in FIG. 3B, the ceramic balls 300 are compressed and cured to make them into a circular planar shape, thereby forming a porous plate 310. Before compressing and curing the ceramic balls 300 to form the circular porous plate 310, an adhesive agent can be applied on the surfaces of ceramic balls in order to attach the ceramic balls 300 to one another and then to easily form the plate.

Figure 3C:
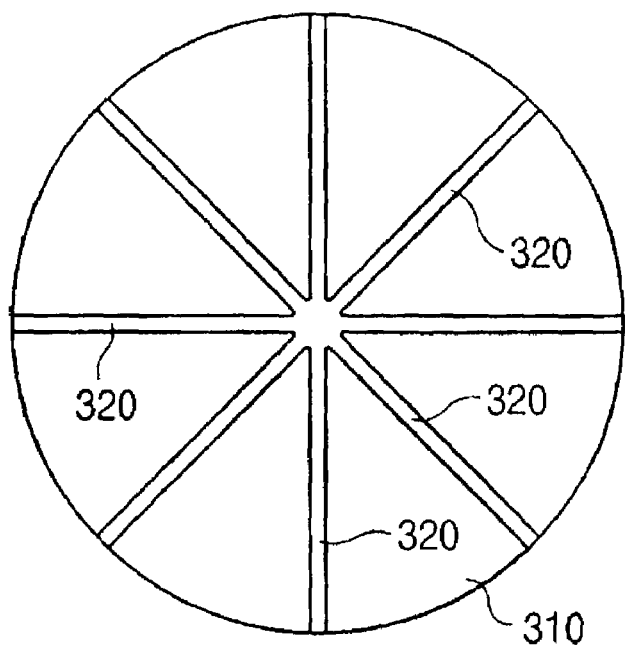

FIG. 3C is a schematic plan view of the circular porous plate 310 and illustrating a step of forming gas flow grooves 320. As shown, the gas flow grooves 320 are formed on the upper surface of the porous plate 310 in a symmetrical radial shape. Although the gas flow grooves 320 are formed to have the symmetrical radial shape in the present invention, they can be designed in various shapes depending on process characteristics.

Without other additional processes, the porous plate 310 formed through the abovementioned process can have plenty of gas-supplying passages (i.e., the gaps among the ceramic balls 300) therein, as compared to the shower head of the related art. In the present invention, the process gases supplied into the ICP etcher through the porous plate 310 collide against the ceramic balls 310 of the porous plate 310. Therefore, the supplied process gases evenly disperse and the gas pressure also uniformly distributes.

Figure 3D:
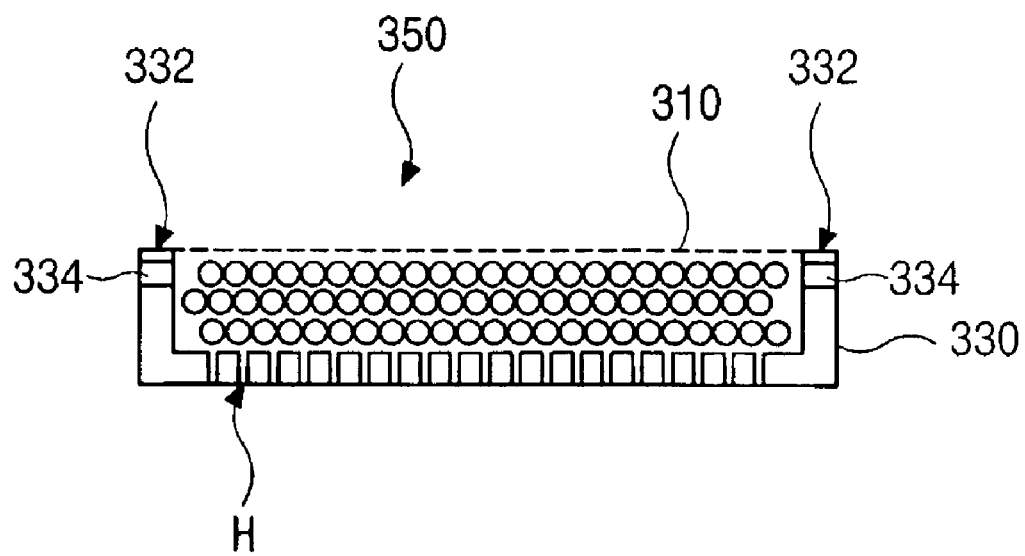

In FIG. 3D, a gas distribution plate 330 surrounds the lower and side portions of the porous plate 310, thereby completing the gas diffusion plate 350 for use in the ICP etcher. The gas distribution plate 330 has a plurality of gas-feed holes H at the bottom, and then such gas-feed holes H uniformly distributes at the bottom of the gas distribution plate 330. Moreover, the gas distribution plate 330 has gas-feed passages 334 in its side portions 332, and then each gas-feed passage 334 corresponds to each gas flow groove 320 formed on the upper portion of the porous plate 310 (see FIG. 3C). The gas distribution plate 330 reinforces the porous plate 310 and compensates the structural weakness of the porous plate 310 because the porous plate 310 may be weak for the external stress caused by the supplied gases or plasma. Furthermore, the gas distribution plate 330 uniformly distributes the equally pressurized process gases onto the semiconductor wafer.

Figure 4:
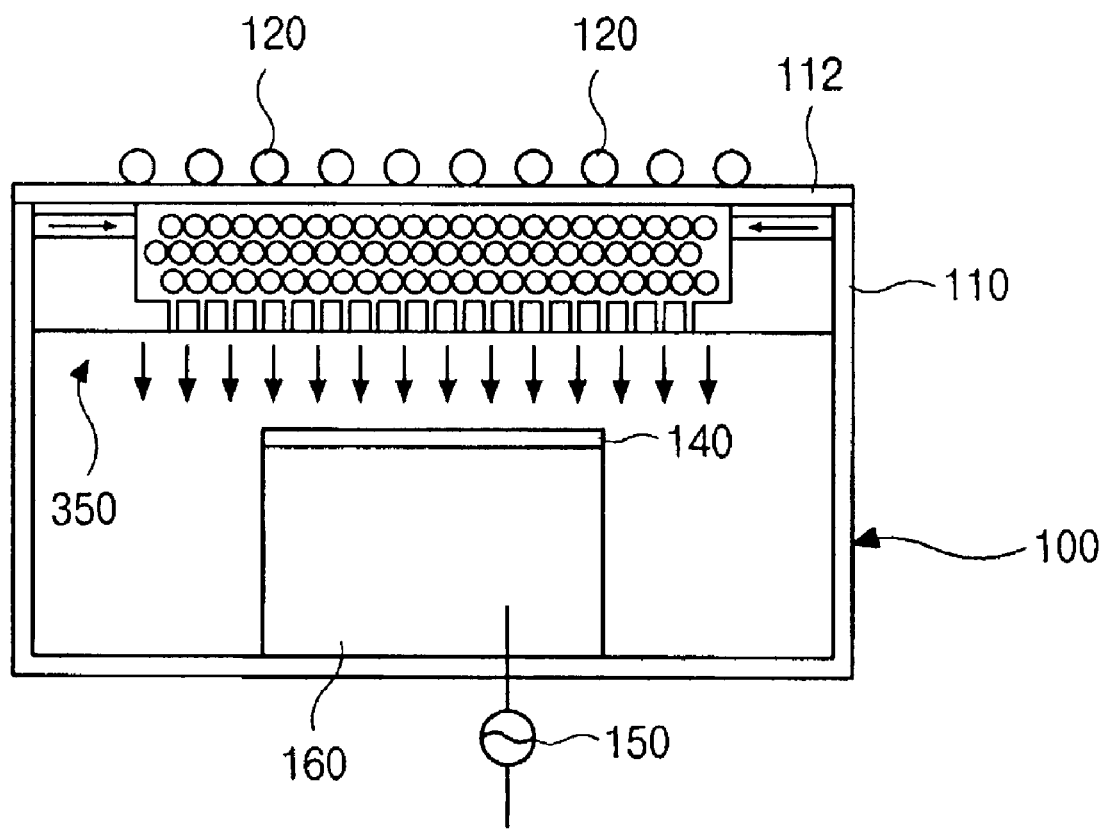
FIG. 4 schematically illustrates a diagram of the ICP etcher adopting the gas diffusion plate according to the present invention.

FIG. 4 schematically illustrates a diagram of an ICP etcher adopting the gas diffusion plate 350 according to the present invention.

Referring to FIG. 4, the ICP etcher of the present invention has a chamber 100 and a chamber cover 112 at the top of the chamber 100. Inside the chamber 100, a chuck supporter 160 is disposed at the bottom, and then the electrostatic chuck 140 is disposed on the chuck supporter 160. The chuck supporter 160 is electrically connected to an RF (radio frequency) power supply 150 to supply electric power to the electrostatic chuck 140. During the process in the ICP etcher, the semiconductor wafer (not shown) is mounted on the electrostatic chuck 140. An ICP antenna 120 is disposed on the front surface of the chamber cover 112, and the gas diffusion plate 350 illustrated with reference to FIGS. 3A–3D is disposed on the rear surface of the chamber cover 112. When performing the process in the ICP etcher, the gas diffusion plate 350 uniformly supplies the process gases with uniform pressure so that the superior uniformity of etching process can be obtained.

When performing the etching process using the ICP etcher shown in FIG. 4, the process gases flow as the following order; (a) through the gas-supplying passages formed in a chamber wall 110, (b) though the gas-feed passages 334 formed in the side portion 332 of the gas distribution plate 330, (c) through the gas flow grooves 320 formed on the upper surface of the porous plate 310, (d) through the gaps among the ceramic balls 300 of the porous plate 310, and (e) through the gas-feed holes H formed at the bottom of the gas distribution plate 330. The process gases passing through the gas diffusion plate 350 of the present invention are uniformly applied to the semiconductor wafer. Further, since the process gases flow through the gaps among the ceramic balls 300 of the porous plate 310, the process gases can have the uniform pressure wherever the process gases are supplied, for example, supplied from the central or peripheral portion of the gas diffusion plate 350. Accordingly, the supplied process gases can have the uniform dispersion and pressure, and then the gas diffusion plate 350 of the present invention can lead the etching process to have the superior uniformity.

It will be apparent to those skilled in the art that various modifications and variations can be made in the present invention without departing from the spirit or scope of the inventions. Thus, it is intended that the present invention cover the modifications and variations of this invention provided they come within the scope of the appended claims and their equivalents.

What is claimed is:

1. A gas diffusion plate supplying process gases into a chamber of an ICP (inductively coupled plasma) etcher, comprising; a plurality of balls connected together in the form of a porous plate having a plurality of gaps being defined between said plurality of balls allowing for the passage and dispersement of the process gas, wherein the plurality of balls have diameters ranging from 0.5 to 5 millimeters (mm), a gas distribution plate having a plurality of gas-feed holes at the bottom thereof, the gas distribution plate surrounding lower and side portions of the porous plate; and a plurality of gas-feed passages in the side portion of the gas distribution plate.

2. The gas diffusion plate of claim 1, wherein the plurality of balls are ceramic balls.

3. The gas diffusion plate of claim 1, wherein the plurality of balls are VESPEL™ balls.

4. The gas diffusion plate of claim 3, wherein the VESPEL™ balls are a polymer based material.

5. The gas diffusion plate of claim 1, wherein the plurality of gas-feed holes are uniformly distributed at the bottom of the gas distribution plate.

6. The gas diffusion plate of claim 1 wherein the plurality of gas-feed passages correspond to the plurality of gas flow grooves so as to feed the process gases into the chamber through the porous plate.

7. The gas diffusion plate of claim 1, wherein the plurality of balls have a diameter of about 1 millimeter (mm).

8. The gas diffusion plate of claim 1, wherein the plurality of balls include an adhesive agent on the surfaces thereof before being compressed and cured.

9. The gas diffusion plate of claim 1, wherein the plurality of gas flow grooves have a symmetrical radial shape.

10. The gas diffusion plate of claim 1, further comprising a plurality of gas flow grooves on the porous plate.

11. The gas diffusion plate of claim 1, wherein the porous plate has a circular planar shape.

* * * * *